United States Patent [19]
Elms

[11] Patent Number: 5,606,249
[45] Date of Patent: Feb. 25, 1997

[54] ELECTRICAL APPARATUS WITH WIDE DYNAMIC RANGE FOR MONITORING AND PROTECTING ELECTRIC POWER SYSTEMS

[75] Inventor: Robert T. Elms, Monroeville, Pa.

[73] Assignee: Eaton Corporation, Cleveland, Ohio

[21] Appl. No.: 379,418

[22] Filed: Jan. 27, 1995

[51] Int. Cl.$^6$ .............................. G01R 15/08; G01R 1/30
[52] U.S. Cl. ........................................ 324/115; 324/123 R
[58] Field of Search ................................. 324/99 D, 115, 324/107, 123 R; 361/96; 364/483

[56] References Cited

U.S. PATENT DOCUMENTS

| | | | |
|---|---|---|---|
| 3,159,787 | 12/1964 | Sexton | 324/99 D |
| 3,187,323 | 6/1965 | Flood et al. | 324/115 |
| 3,652,934 | 3/1972 | Paljug | 324/115 |
| 4,068,185 | 1/1978 | Christen et al. | 324/115 |
| 4,541,065 | 9/1985 | Faulkner et al. | 324/99 D |
| 4,933,631 | 6/1990 | Eccleston | 324/115 |
| 5,270,898 | 12/1993 | Elms et al. | 361/96 |
| 5,332,963 | 7/1994 | Hightower et al. | 324/115 |

OTHER PUBLICATIONS

*3030/3060 Power Profiler User's Guide*, Basic Measuring Instruments (BMI); P/N 89001985; Rev. Jul. 1989; Cover Page and pp. 11.1 and 11.7.

*Primary Examiner*—Ernest F. Karlsen
*Attorney, Agent, or Firm*—Martin J. Moran

[57] ABSTRACT

Electric apparatus responsive to currents and/or voltages having wide dynamic ranges incorporates ranging circuits for each input in which a multiplexer providing the ranging selection has a common input connected to the output of an operational amplifier providing the selective gain and has a plurality of outputs connecting selected ones of a plurality of series connected precision resistors in a feedback loop around the operational amplifier. A second operational amplifier is connected as a follower to the last output of the multiplexer so that the gain applied to the output signal is not distorted by the resistance of the switches in the multiplexer. For three-phase systems not having a neutral conductor, phase to neutral voltages with ranging are generated by subtracting a neutral-to-ground voltage produced from an artificial ground created by connecting three resistors in a wye across the phase conductors from the phase-to-ground voltages applied to the ranging circuit input.

8 Claims, 3 Drawing Sheets

5,606,249

ELECTRICAL APPARATUS WITH WIDE DYNAMIC RANGE FOR MONITORING AND PROTECTING ELECTRIC POWER SYSTEMS

BACKGROUND OF THE INVENTION

1. Field of the Invention

This invention relates to apparatus which responds to electrical signals having a wide dynamic range, particularly the currents and voltages in an electric power distribution system. It also relates to such apparatus which responds to voltages of wide dynamic range in three-phase electrical systems without a neutral.

2. Background Information

Electrical apparatus such as monitors, meters and analyzers used with electrical power systems often must respond to signals with wide dynamic ranges. This is also true of circuit interrupters used in such systems which also incorporate metering functions as well as protection functions. Such electrical apparatus commonly employs ranging circuits to handle the wide dynamic ranges of the input currents and voltages. These ranging circuits typically utilize multiplexers to switch signals from a resistor ladder into the input of an operational amplifier. However, with the ranging in the input circuit of the operational amplifier, the maximum input voltage must be designed to be less than the voltage rating of the analog switches of the multiplexer. This means that small input voltages must be measured at the low end for signals with wide dynamic range, and over-voltage protection for the analog switches must be added. Attempts to place the multiplexer in the feedback circuit of the operational amplifier have produced inaccurate results because the analog switch resistances became pan of the gain determining resistance.

There is a need therefore, for improved apparatus which responds to electrical signals of wide dynamic range.

More particularly, there is a need for such improved apparatus which does not require that the switches of the ranging circuit be able to withstand the maximum voltage produced by the wide dynamic range input signal.

There is a further need for such improved apparatus which can include the multiplexer switches in the output circuit of the operational amplifier without generating inaccuracies in the conditioned signal.

There is a further need for such improved electrical apparatus responsive to wide range signals in three-phase electric power systems.

There is also a need for such improved apparatus which can provide accurate ranging for phase-to-neutral voltages in three-phase electrical systems without a neutral.

SUMMARY OF THE INVENTION

These and other needs are provided by the invention which is directed to electrical apparatus for use with an electrical system having power related waveforms with wide dynamic ranges. The improved apparatus places the multiplexer in the output circuit of the ranging circuit operational amplifier without affecting the accuracy of the conditioned signals. This is achieved by connecting the multiplexer directly to the output of the operational amplifier with the multiple outlets of the multiplexer then connecting precision resistors in a feedback loop to the input of the operational amplifier. The output is then taken not from the output of the operational amplifier, but from a point between the multiplexer and the precision resistors so that the multiplexer switch resistances are not part of the gain determining resistance. The output is taken through a second operational amplifier connected as a follower. The second operational amplifier should draw very little current, and therefore can be a device such as a bi-FET.

More specifically, a plurality of precision resistors are connected in series. One of the resistors is connected between one of the outputs of the multiplexer and the inverting input of the first operational amplifier. The other precision resistors are each connected between adjacent outputs of the multiplexer between the first output and a last output. The second, buffer operational amplifier is connected as a voltage follower to the last output of the multiplexer. In a three-phase system, separate ranging circuits are provided for each of the current and voltages to be input to the apparatus.

As another aspect of the invention, in a three-phase electrical system without a neutral, an artificial neutral is created by connecting thee neutral generating resistors in a wye to the phase conductors. This artificial neutral is then connected to an inverting input of an artificial neutral operational amplifier to generate a voltage representing the difference between the artificial neutral voltage and ground. This artificial neutral voltage is then subtracted from the phase voltages applied to the respective ranging circuits by connecting the output of the artificial neutral operational amplifier to the inverting input of the first operational amplifier of each of the voltage ranging circuits.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention will be described as applied to a monitor/analyzer used to perform metering functions and waveform analysis in a power distribution system. Such apparatus must typically respond to signals having wide dynamic ranges. Application of the invention to a monitor/analyzer is for illustrative purposes only, and it will be evident to those skilled in the art that the invention has application to other apparatus which is responsive to electrical signals with wide dynamic ranges.

Figure 1:
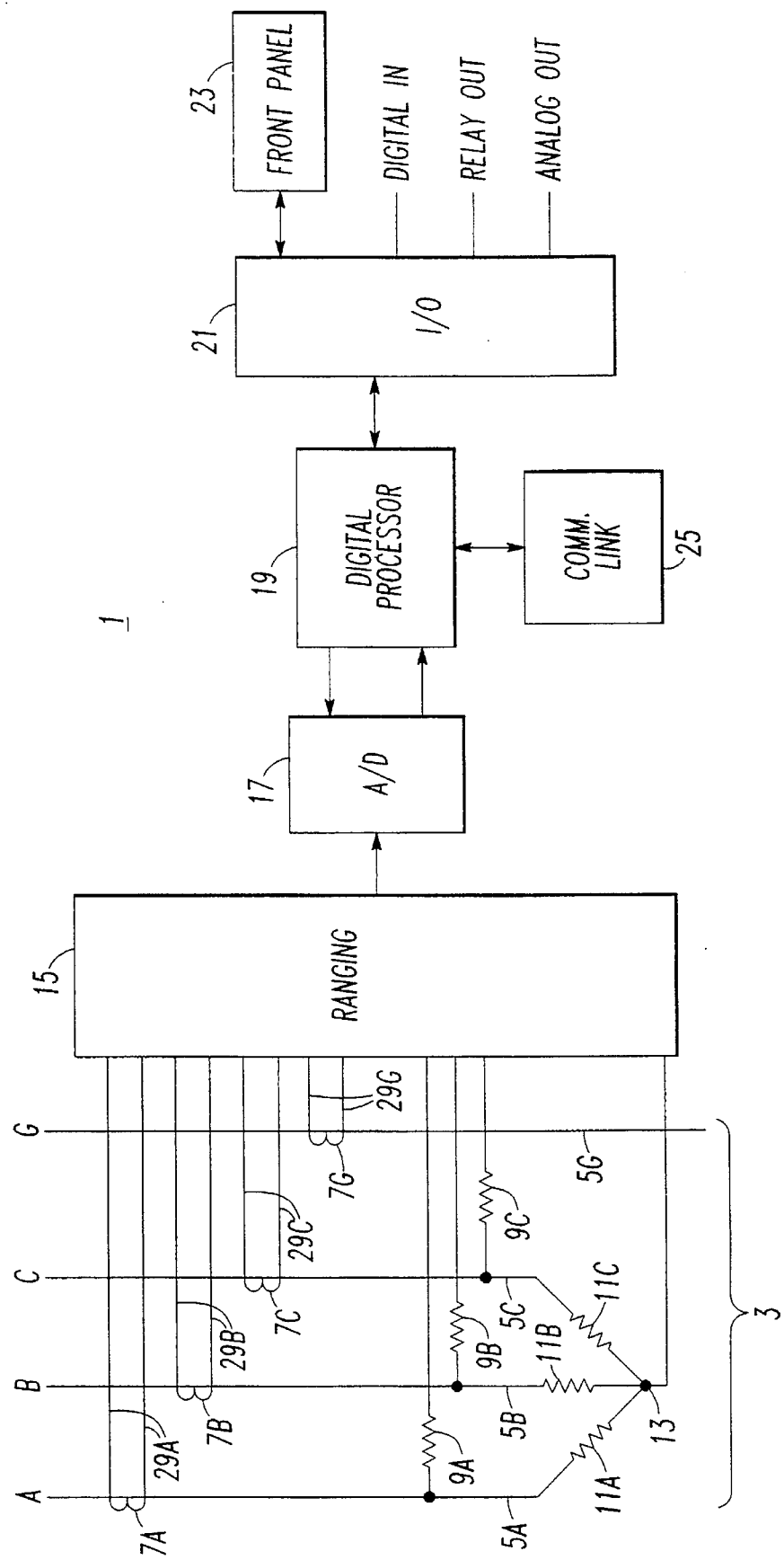
FIG. 1 is a schematic diagram of a monitor/waveform analyzer for an electric power distribution system incorporating the invention.

As shown in FIG. 1, the exemplary monitor/analyzer 1 to which the invention has been applied, is used to monitor and analyze an ac electrical power system 3 such as a power distribution system. The power distribution system 3 illustrated has three phase conductors 5A, 5B and 5C, and a ground conductor 5G. The power distribution system 3 could also have a neutral conductor, although such a conductor is not shown in the system of FIG. 1 in order to illustrate an aspect of the invention applicable to systems without a neutral conductor.

Current transformers 7A, 7B, 7C and 7G sense current flowing in the respective conductors while phase-to-ground voltages are sensed through sensing resistors 9A, 9B and 9C. An artificial neutral is generated in accordance with the invention by three neutral generating resistors 11A, 11B, and 11C connected in a wye between the respective phase conductors 5A, 5B, and 5C and a neutral node 13.

The sensed current signals generated by the current transformers 7A, 7B, and 7C, the sensed phase to ground voltages generated by the resistors 9A, 9B, and 9C and the artificial neutral voltage generated at the node 13 are applied to a ranging circuit 15 which, as will be described, converts the range of the signals for application to an analog to digital (A/D) converter 17 for input to a digital processor 19. The A/D converter 17 samples the analog voltages and currents at sampling rates determined by interrupts generated by the digital processor 19.

The digital processor 19 utilizes the data generated by the digital samples to perform the metering and analyzing functions. The metering function includes the calculation of parameters such as rms currents and voltages, peak currents and voltages, minimum currents and voltages, power factor, watts, Vars, volt-amps, K-factor, CBMEA derating factor, and the like. For the analysis function, the monitor/analyzer 1 stores the raw waveform data for later or remote display, and calculates therefrom harmonic distortion. The digital processor 19 has an input/output (I/O) 21 through which the processor 19 is connected to a front panel 23. The front panel 23 serves as the interface with the user. It is through the front panel 23 that the user can control operation of the monitor/analyzer 1 and monitor the ac electrical power system 3. The I/O device 21 also interfaces the digital processor 19 with contact inputs through a digital input. Relay outputs and analog outputs are also provided through the I/O device 21. The digital processor 19 can also communicate with a remote processor through a communications link 25. Through this communications link 25, the monitor/analyzer 1 can provide information to and/or be controlled by a remote processor (not shown).

Figure 2:
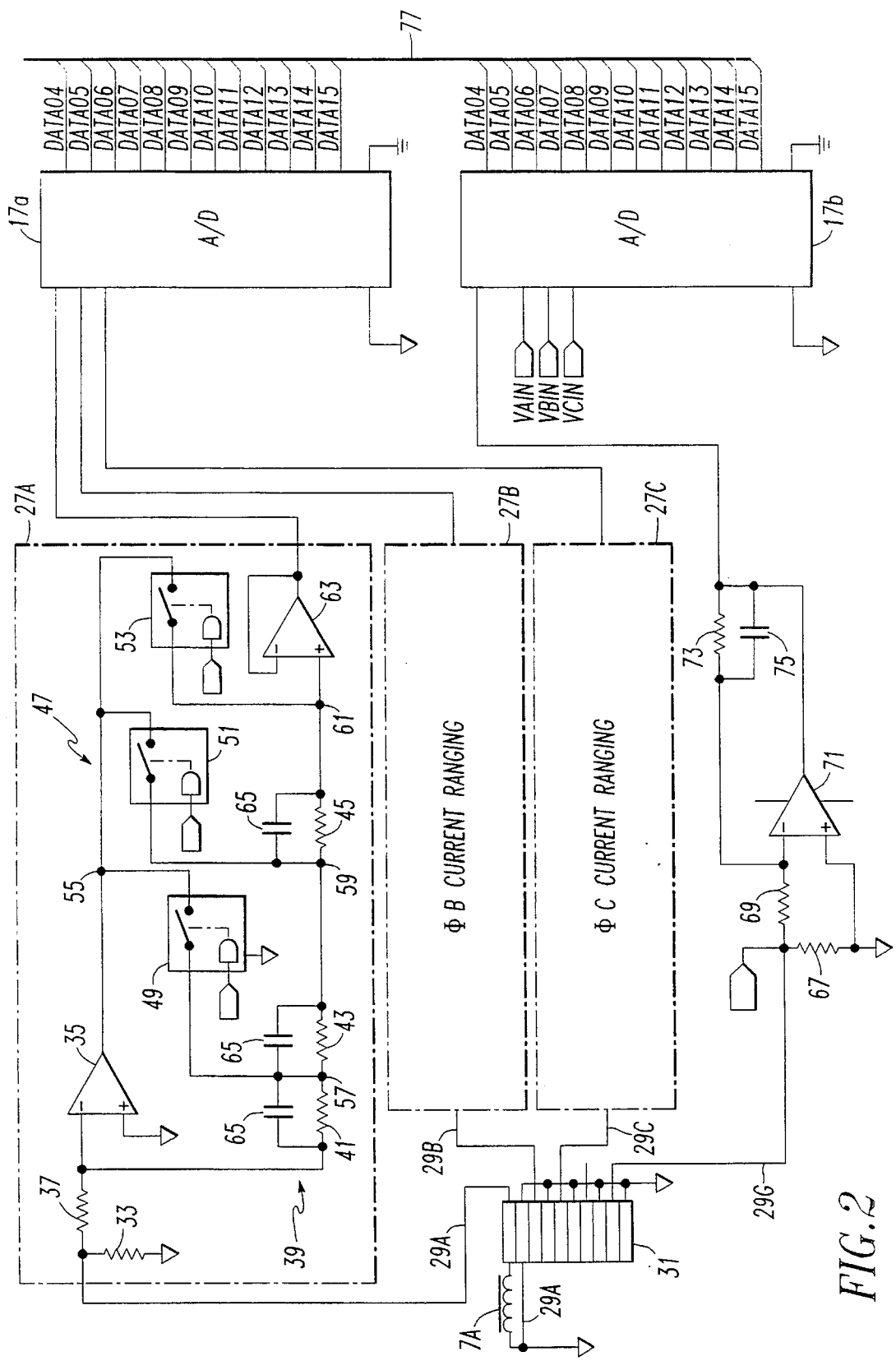
FIG. 2 is a schematic circuit diagram of the ranging circuits for currents which form part of the monitor/waveform analyzer of FIG. 1.

FIG. 2 illustrates the circuits within the ranging circuit 15 which selectively apply appropriate gain to the sensed current signals generated by the current transformer 7 for conversion by the A/D converter module 17. Each of the current ranging circuits 27A, 27B, 27C and 27G has an input lead 29A, 29B, 29C and 29G connected through a connector 31 to one side of the secondary winding of the corresponding current transformer 7A, 7B, 7C and 7G. The other side of the secondary winding of each of the current transformers is connected through the connector 31 to analog ground. The ranging circuits 27 for all of the phase currents are identical, hence only the circuit for phase A will be described. The current from the secondary current transformer is converted to a voltage by a resistor 33. This voltage is applied to the inverting input of a first operational amplifier 35 through an input resistor 37. The non-inverting input of the operational amplifier 35 is connected to analog ground. A feed back loop 39 connected from the output to the inverting input of the operational amplifier 35 includes a plurality of precision resistors 41, 43 and 45 connected in series. A multiplexer 47 comprises a plurality of solid state switches 49, 51 and 53 each having one terminal connected to a common terminal on the other switches to form a common input 55 which is connected to the output of the first operational amplifier 35. The other terminal of the switch 49 forms the first multiplexer output 57 which is connected between the precision resistors 41 and 43. The second terminal of the switch 51 is connected between the resistors 43 and 45 to form a second output 59 of the multiplexer, while the second terminal of the switch 53 forms the last output 61 of the multiplexer which is connected to the precision resistor 45.

It can be seen then that the gain applied by the first operational amplifier 35 to the input signal is a function of the ratio of the total resistance of the resistors 41, 43 and 45 inserted in the feedback loop by the multiplexer 47 to the value of the resistance of the input resistor 37. In the exemplary embodiment of the invention, the values of the resistors 37, 41, 43, and 45 are selected such that the gain of the operational amplifier 35 is 1:4:8 with the switches 49, 51 and 53 closed respectively.

The input of a second operational amplifier 63 is connected as a voltage follower to the last output 61 of the multiplexer 47. With this arrangement, the resistance of the selected switch of the multiplexer 47 is not part of the gain determining resistance which sets the magnitude of the voltage seen by the follower op amp 63. However, this second operational amplifier 63 must have a high input impedance so that negligible current is drawn through the resistor 45 when the switch 51 is closed, or through the resistors 43 and 45 when the switch 49 is closed. In the exemplary embodiment of the invention a bi FET is used for the operational amplifier 63 to satisfy this requirement. Noise suppressing capacitors 65 are provided across the feedback resistors 41, 43 and 45.

As mentioned, the current ranging circuits 27B, and 27C for the other phase currents (and for the neutral current if a neutral conductor were present) are identical to that just described for phase A. A ranging circuit is not required for the ground current, as this signal remains within a range which can be accommodated by a single gain setting. Thus, the ground current signal is converted to a voltage by the resistor 67 and applied through an input resistor 69 to an operational amplifier 71. A single precision resistor 73 is provided in a feedback loop. A capacitor 75 across the feedback resistor 73 suppresses high frequency noise.

As discussed in connection with FIG. 1, the outputs of the current ranging circuits are applied to the A/D converter 17. In the exemplary implementation of the invention, AOD7874BR A/D converters 17a and 17b are utilized. Each of these A/D converters incorporates a four input multiplexer. Thus, the conditioned currents from the current ranging circuits 27A, 27B, and 27C are applied to the A/D converter 17a while the ground current is applied to the A/D converter 17b. These A/D converters 17a and 17b convert the applied analog signal into twelve bit digital signals for input to the digital processor on data lines 77. Selection of the analog signal to be converted is controlled by the digital processor 19.

Figure 3:
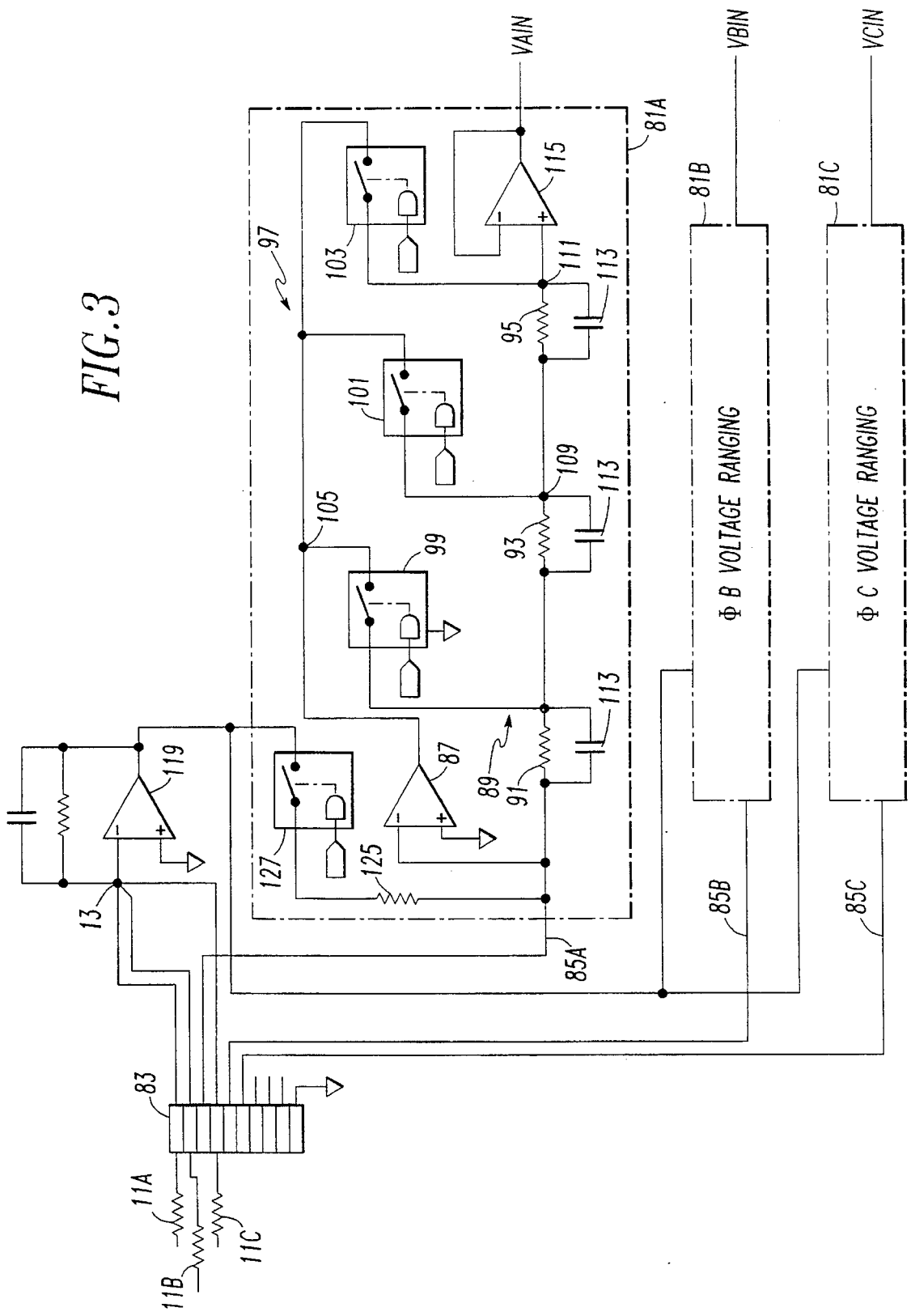
FIG. 3 is a schematic circuit diagram of the ranging circuits for voltages which form part of the monitor/analyzer of FIG. 1.

FIG. 3 illustrates the voltage arranging circuits 81A, 81B and 81C for the respective phase voltages. Again, only the ranging circuit 81A for the phase A voltage will be explained in detail. The phase A voltage ranging circuit 81A is connected to the sensing resistor 9A through a connector 83 and input lead 85A. The sensed voltage is applied to the inverting input of a first operational amplifier 87 which is referenced to ground through its non-inverting input. As in the case of a current ranging circuit, a feedback loop 89 for the op amps 87 includes a plurality of precision resistors 91, 93 and 95 connected in series, and a multiplexer 97 which includes a plurality of switches 99, 101 and 103. One terminal of each of the switches 99, 101 and 103 is connected to a common terminal on the others to form a multiplexer input 105. The second terminal of the switch 99 forms a first output 107 of the multiplexer 97 which is connected between the precision resistors 91 and 93. The second output of the switch 101 forms the second output 109 of the multiplexer 97 connected between resistors 93 and 95, while the second output of the switch 103 forms a last output 111 of the multiplexer 97 which is connected to the resistor 95. Again, the ratio of the total resistance of the selected precision resistors 91, 93 and 95 to the resistance of the sensing resistor 9A determine the gain of the op amp 87. As in the case of the current ranging circuits, the values of these resistors are selected such that the ratio of the gains with the switches 99, 101 and 103 closed are 1:2:4, respectively. The capacitors 113 suppress noise across the precision resistors 91, 93 and 95.

A second operational amplifier 115 is connected to the last output 111 of the multiplexer 97 as a voltage follower to generate the output for the ranging circuit 81. As this voltage ranging circuit is similar to the current ranging circuit described above, the resistances of the switches 99, 101, and 103 are not part of the feedback resistance which determines the gain of the op amp 87, and thus, do not produce an error in the conditioned signals. The second operational amplifier 115 is also a bi FET amplifier which draws negligible input current so that the resistors 93 and 95 do not cause any appreciable error in the output signal.

If as in the exemplary power system there is no neutral conductor, so that the artificial neutral 13 is formed as discussed in connection with FIG. 1, circuitry is provided in FIG. 3 for generating an artificial neutral to ground voltage which is subtracted from the voltage sensed by the sensing resistors 9 to provide that the voltage output by the second operational amplifier 115 is a phase to ground voltage. In the exemplary embodiment of the invention, the artificial ground 13 is formed by bringing the leads from the neutral forming resistors 11A, 11B and 11C in through the connector 83. The voltage of this artificial neutral is applied to the inverting input of an operational amplifier 119. The non-inverting input of the op amp 119 is connected to analog ground so that the output of the operational amplifier 119 is the artificial neutral to ground voltage. The value of the feedback resistor 121 for the operational amplifier 119 is selected to provide a gain of 1. A capacitor 123 suppresses noise in the feedback circuit. As the neutral to ground voltage is inverted by the operational amplifier 119 it can be subtracted from the phase-to-ground voltage sensed by the resistor 9A by connecting it through a resistor 125 to the inverting input of the op amp 87. A switch 127 allows the neutral to ground voltage to be applied to the operational amplifier 87 only when a neutral conductor is not present. With a neutral conductor provided the phase to neutral voltage is available directly by connecting the primary of a potential transformer between the phase conductor and the neutral conductor.

The ranging circuits 81B and 81C for the phase B and C voltages respectively are similar to the circuit 81A. These conditioned voltage signals are applied to the second A/D converter chip 176 for selection for digital conversion for input for the digital processor 19.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for use with an electrical system having at least one power related waveform with a wide dynamic range, said apparatus comprising:

sensing means sensing said power related waveform to generate a sensed signal;

ranging means comprising:

a first operational amplifier having an inverting input, a non-inverting input and an output;

an input resistor applying said sensed signal to said inverting input of said first operational amplifier;

a plurality of precision resistors;

a multiplexer connected to said output of said first operational amplifier and to said plurality of precision resistors to selectively connect a selected number of said precision resistors in a feedback loop between said output of said first operational amplifier and said inverting input of said first operational amplifier, and a second operational amplifier connected as a follower between said multiplexer and said precision resistors to generate a conditioned sensed signal at a level selected by said multiplexer; and response means responsive to said conditioned sensed signal to generate an output.

2. The apparatus of claim 1 wherein said precision resistors are connected in series, and said multiplexer has a multiplexer input connected to said output of said first operational amplifier, a plurality of multiplexer outputs and a plurality of switches selectively connecting said multiplexer input to one of said multiplexer outputs, one of said precision resisters being connected between a first multiplexer output and said inverting input of said first operational amplifier and others of said precision resisters being connected between adjacent multiplexer outputs from said first multiplexer output to a last multiplexer output, and said second operational amplifier being connected to said last multiplexer output.

3. The apparatus of claim 2 wherein said second operational amplifier is a bi FET amplifier which draws negligible input current.

4. The apparatus of claim 2 wherein said electrical system has three phase conductors without a neutral conductor and said sensing means comprises artificial neutral generating means generating an artificial neutral, and wherein a separate ranging means is provided for each phase voltage with the input resistor connected to an associated phase conductor and with said artificial neutral also connected to the inverting input of the first operational amplifier.

5. The apparatus of claim 4 wherein said artificial neutral generating means comprises three artificial neutral resistors connected in wye to said three phase conductors to generate said artificial neutral and an artificial neutral operational amplifier having an inverting input connected to said wye and a non-inverting input connected to ground.

6. Apparatus for conditioning wide dynamic range electrical signals comprising:

a first operational amplifier having an inverting input and a non-inverting input, and an output;

an input resistor connected to said inverting input of said first operational amplifier, said electrical signal being applied to said first operational amplifier through said input resistor;

a plurality of precision resistors;

a multiplexer connected to said output of said first operational amplifier and to said plurality of precision resistors to selectively connect a selected number of said precision resistors in a feed back loop between said output and said inverting input of said first operational amplifier; and a second operational amplifier connected as a follower between said multiplexer and said precision resistors to generate a conditioned electrical signal.

7. The apparatus of claim 6 wherein said multiplexer comprises a multiplexer input connected to said output of said first operational amplifier, a plurality of multiplexer outputs, a plurality of switches selectively connecting said multiplexer input to a selected one of said multiplexer outputs, said precision resistors including one precision resistor connected between a first of said multiplexer outputs and said inverting input of said first operational amplifier and other precision resistors connected between adjacent multiplexer outputs from said first multiplexer output to a last multiplexer output, and said second operational amplifier being connected to said last multiplexer output as a voltage follower.

8. The apparatus of claim 7 wherein said second operational amplifier is a bi FET which draws negligible input current.

* * * * *